United States Patent
Andreev et al.

(10) Patent No.: US 6,665,850 B1
(45) Date of Patent: Dec. 16, 2003

(54) SPANNING TREE METHOD FOR K-DIMENSIONAL SPACE

(75) Inventors: Alexander E. Andreev, San Jose, CA (US); Vojislav Vukovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/153,570

(22) Filed: May 22, 2002

(51) Int. Cl.[7] .............................................. G06F 17/50
(52) U.S. Cl. .................................. 716/7; 716/8; 716/12
(58) Field of Search ........................................ 716/7–15

(56) References Cited

U.S. PATENT DOCUMENTS

| | | | | | |
|---|---|---|---|---|---|
| 5,615,128 A | * | 3/1997 | Scepanovic et al. | .......... | 716/13 |
| 5,696,692 A | * | 12/1997 | Saldanha et al. | .............. | 716/1 |
| 5,818,729 A | * | 10/1998 | Wang et al. | .................... | 716/9 |
| 5,822,214 A | * | 10/1998 | Rostoker et al. | .............. | 716/10 |
| 6,067,409 A | * | 5/2000 | Scepanovic et al. | ........... | 716/8 |

\* cited by examiner

*Primary Examiner*—Matthew Smith
*Assistant Examiner*—Paul Dinh
(74) *Attorney, Agent, or Firm*—Suiter-West PC LLO

(57) ABSTRACT

The present invention is directed to a spanning tree method for K dimensional space. To address timing driven buffer insertion and clock routing problems clusters of points must be constructed in 3-dimensional space. The first and second dimensions are coordinates on a plane, while the third dimension is time which is arrival pin time for buffers insertion and clock latency for clock routing. In a first aspect of the present invention, a method includes partitioning an input set of points into a binary tree of partitions so that each leaf partition has maximally a defined number of points. Graph edges are made for the points by connecting each point to its closest points in every of $2^K$ subspaces and the number of graph nodes is then reduced to a predefined value.

23 Claims, 5 Drawing Sheets

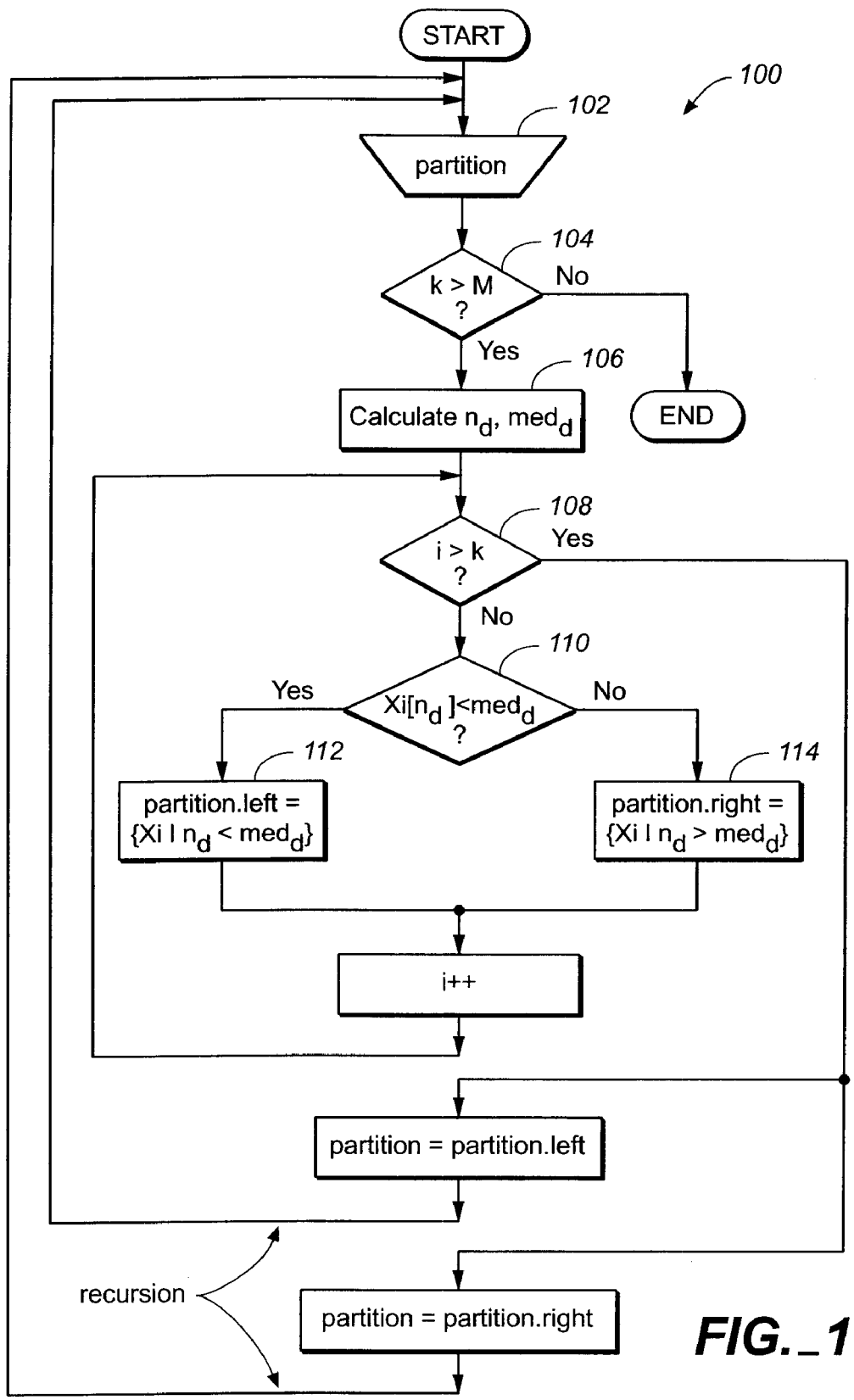
FIG._1

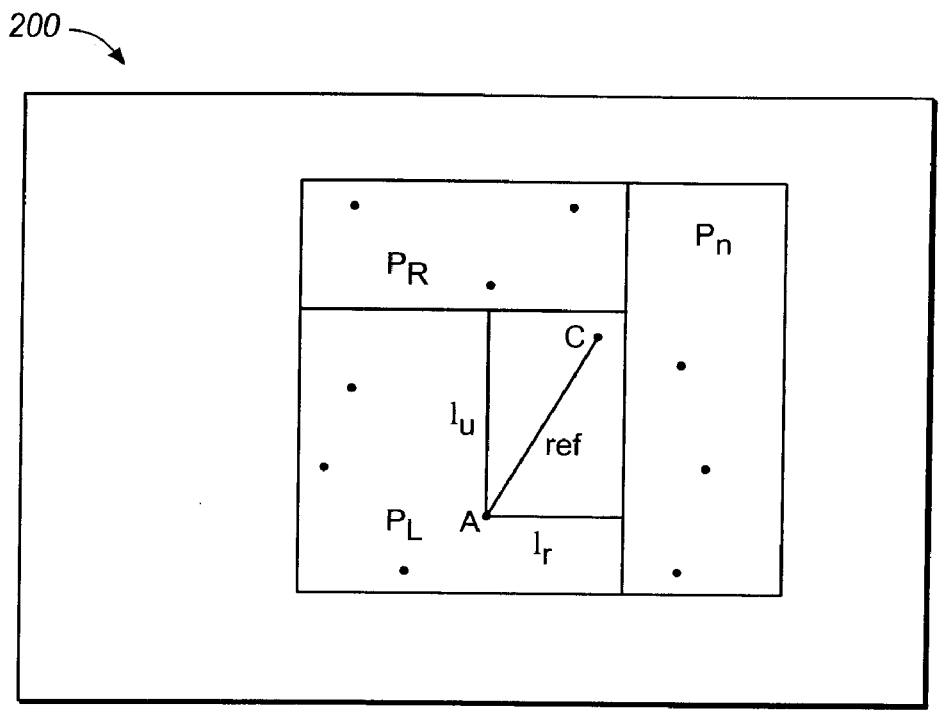
FIG._2
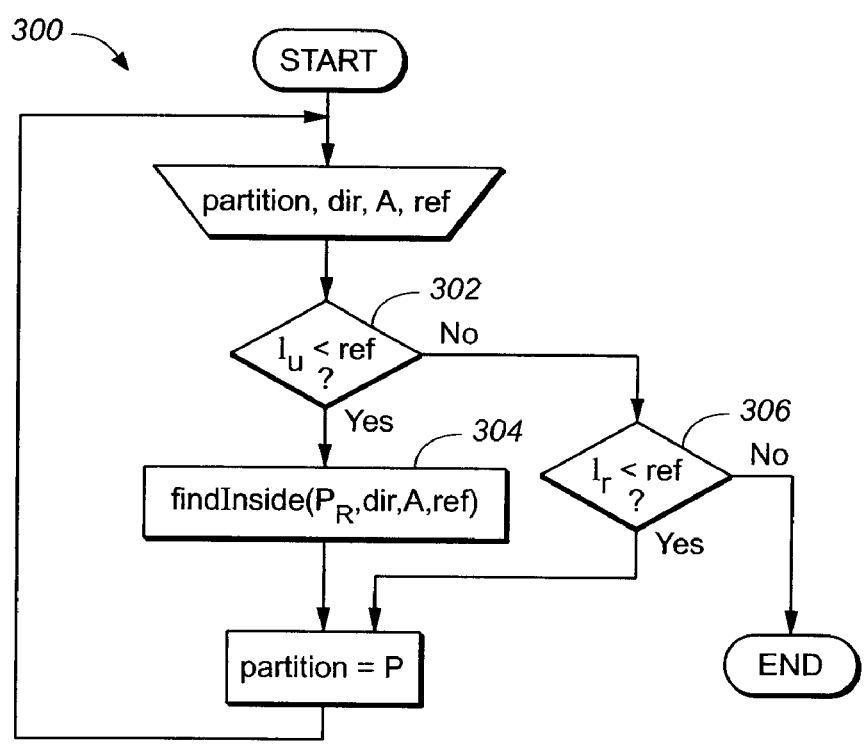
FIG._3

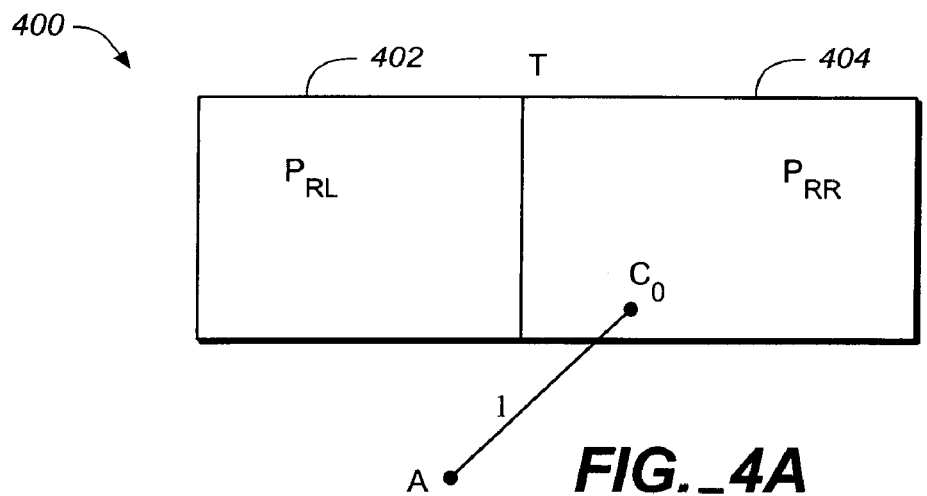
FIG._4A
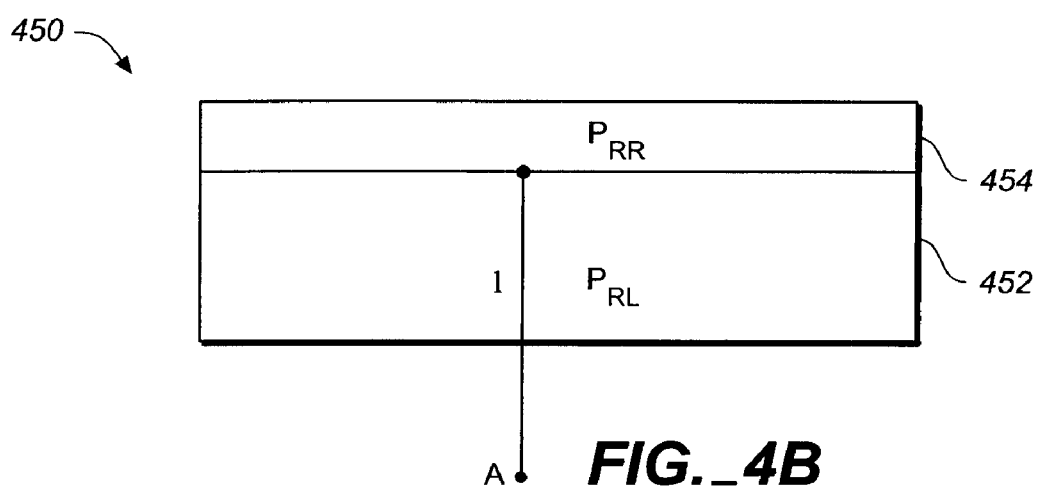
FIG._4B
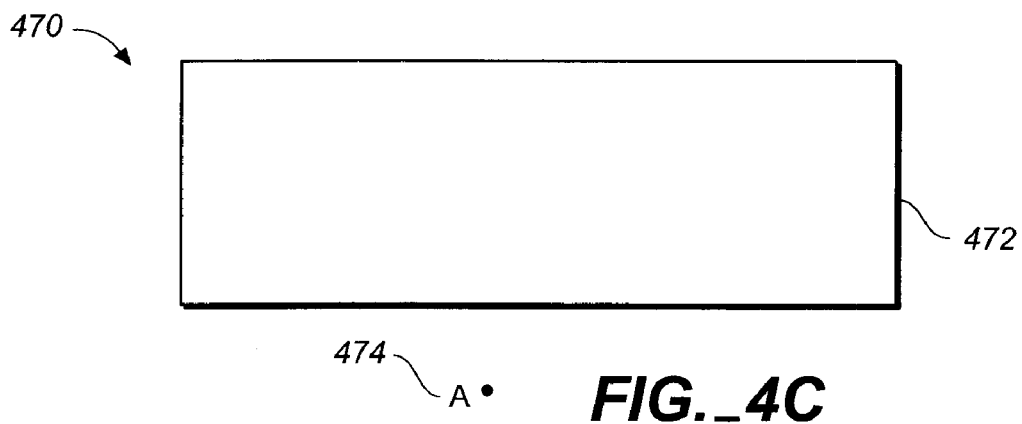
FIG._4C

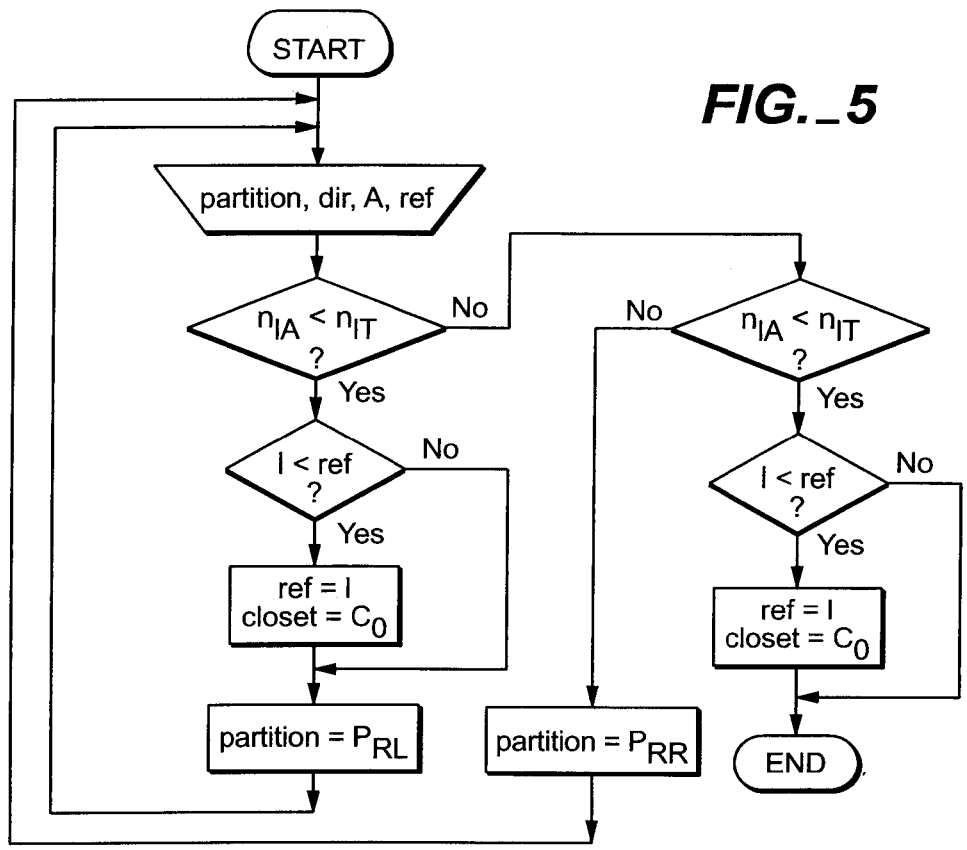
FIG._5
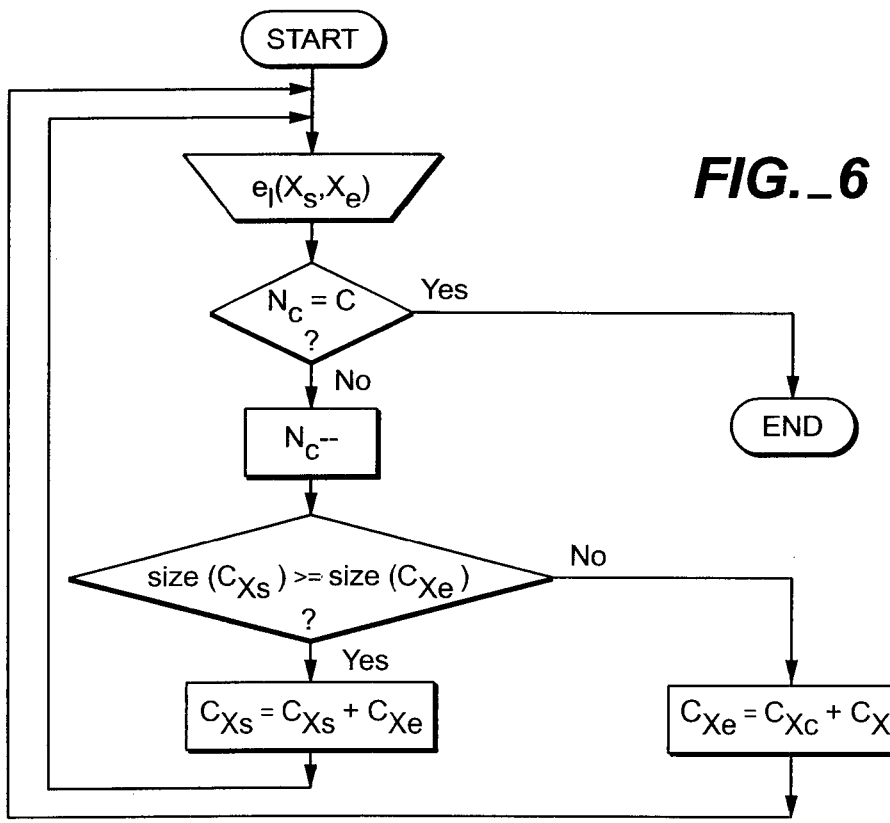
FIG._6

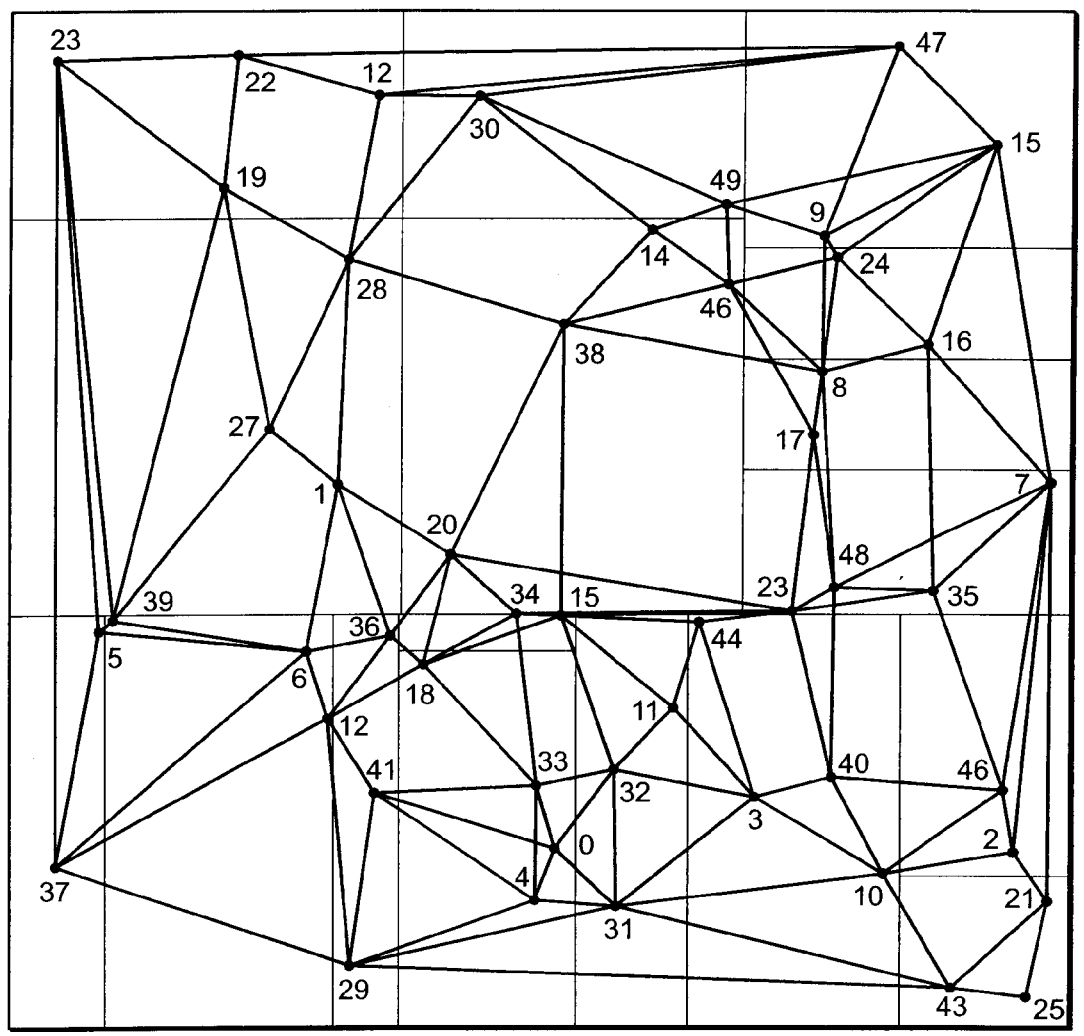
FIG._7

SPANNING TREE METHOD FOR K-DIMENSIONAL SPACE

FIELD OF THE INVENTION

The present invention generally relates to the field of integrated circuit design, and particularly to a method for implementing a spanning tree method for K-dimensional space.

BACKGROUND OF THE INVENTION

The complexity encountered in the design and production of integrated circuits has grown exponentially as the number of features, speed and size of the integrated circuits has grown. For instance, integrated circuits may be found in an ever increasing range of products. To provide the desired functionality for the products, circuits may be designed specifically for the contemplated usage and/or generalized circuits may be employed capably of providing usage desired by a wide range of manufacturers and end users.

There are a wide variety of considerations that must be addressed in the design of the integrated circuit, such as timing considerations. For instance, sections of a chip may be able to perform operations in different amounts of time, such as based on the complexity of the calculation. Additionally, the transfer of data between components of an integrated circuit may be performed in different lengths of time, such time depending distance the information must travel to arrive at a desired component, and the like.

To address these timing considerations, integrated circuit may be arranged in an optimal manner, buffers employed to store data so that it is ready when needed, and the like. However, previous methods utilized to compute the placement of buffers, routing and the like were inefficient and overly complex.

Therefore, it would be desirable to provide a spanning tree system and method for K dimensional space.

SUMMARY OF THE INVENTION

Accordingly, the present invention is directed to a spanning tree method for K dimensional space. To address timing driven buffer insertion and clock routing problems clusters of points must be constructed in 3-dimensional space. The first and second dimensions are coordinates on a plane, while the third dimension is time which is arrival pin time for buffers insertion and clock latency for clock routing. In a first aspect of the present invention, a method includes partitioning an input set of points into a binary tree of partitions so that each leaf partition has maximally a defined number of points. Graph edges are made for the points by connecting each point to its closest point in every of $2^K$ subspaces and the number of graph nodes is then reduced to a predefined value.

In an additional aspect of the present invention, a method for partitioning an integrated circuit includes partitioning an input set of points into a binary tree of partitions so that each leaf partition of the binary tree has maximally a defined number of points. Graph edges for the points are made by connecting each point to $2^K$ closest points. The starting number of graph points is then factorized by decreasing a number of components in the set of graph points until that number becomes equal to a predefined specified program input parameter C.

In a further aspect of the present invention, a system includes a memory suitable for storing a program of instructions and a processor communicatively coupled to the memory, the processor suitable for performing a program of instructions. The program of instructions configures the processor to partition an input set of points into a binary tree of partitions so that each leaf partition of the binary tree has maximally a defined number of points. Graph edges are made for the points by connecting each point to its closest point in every of $2^K$ subspaces. The number of graph nodes is reduced by factorizing a number of constructed components in the set of graph points until it becomes equal to a predefined specified program input parameter C.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a flow diagram of an exemplary method of the present invention wherein a partitioning method is shown suitable for operating in accordance with the present invention;

FIG. 2 is a top view depiction of an illustration of an integrated circuit having partitions and points;

FIG. 3 is a flow diagram of an exemplary method of the present invention wherein a method for finding a closest point is shown;

FIGS. 4A, 4B & 4C are top-view illustrations of points and partitions in a variety of configurations;

FIG. 5 is a flow diagram of an exemplary method of the present invention wherein a method findInside is shown;

FIG. 6 is a flow diagram of an exemplary method of the present invention wherein a method of making components is shown; and FIG. 7 is a top view illustration of an embodiment of the present invention showing a spanning tree example.

DETAILED DESCRIPTION OF THE INVENTION

Reference will now be made in detail to the presently preferred embodiments of the invention, examples of which are illustrated in the accompanying drawings.

Referring generally now to FIGS. 1 through 7, exemplary embodiments of the present invention are shown. To address timing driven buffer insertion and clock routing problems clusters of points must be constructed in 3-dimensional space. The first and second dimensions are coordinates on a plane, while the third dimension is time which is arrival pin time for buffers insertion and clock latency for clock routing.

In an embodiment of the present invention, partitioning is performed on the base of a minimal spanning tree. There are methods of E log E complexity where E is the number of edges in the graph, such as the method described in Algorithms for VLSI Physical Design Automation, by Naveed Sherwani, Kluwer Academic Publishers (1995), which is herein incorporated by reference in its entirety. However, in the present invention, a general method is employed which has $N(\log N)^2$ complexity, because any two of N points may be potentially connected by some edge. The present invention may be employed in two, three or more dimensional Euclidean space with Manhattan distance between points.

Instead of considering all possible edges for N input points, the present invention constructs a special graph. Each vertex has at most $2^K$ closest vertexes in this graph. The linear dependence between the number of edges and the number of points reduces the complexity of the problem. The overall complexity of the method is $N(\log N)^2$. The present invention may be employed in a FFS search engine, as described in U.S. patent application Ser. No. 09/678,313, titled "Fast Flexible Search Engine for Perfect Match", filed Oct. 4, 2000; and U.S. patent application Ser. No. 09/678, 313, titled "Fast Flexible Search Engine for Longest Prefix Match", filed Oct. 4, 2000, which are herein incorporated by reference in their entirety.

The Spanning Tree Method

In an embodiment of the present invention, the method includes three main parts:

a partitioning method;

a method for making graph edges; and a method for reducing the number of graph vertexes.

The flow starts by partitioning given input set of points $X_i(n_1, n_2, \ldots, n_K)$, i=1, 2, ... N into a binary tree of partitions using a rule that every leaf partition may maximally have previously a defined number of points M. Progressing through the partitions tree, the second part of the program is performed so that for every point the $2^K$ closest points are found in the $2^K$ directions of matter (K=2: right up, left up, left down, right down) and those points are connected thereby making edges of the graph. Based on the estimated edges, the final method decreases the number of components in the set of vertexes (a component contains one or more vertexes) until it becomes equal to the specified program input parameter C.

The Partitioning Method

Referring now to FIG. 1, an exemplary method 100 of the present invention is shown wherein a partitioning method operable to embody the present invention is shown. At the first step of the method, the number of points k in the current partition 102 is checked to determine if it is greater than M 104. If it is, the median is calculated for every K coordinate and a coordinate $n_d$ which has the greatest quadratic deviation is chosen as the coordinate by which the partition is divided into two smaller partitions. An index i is implemented which represents the index of current point in the partition 108. Every point that has $n_d$ coordinate value less or equal to the value of its median $med_d$ 110 is put into the "left" child partition 112 and all other points into the "right" child partition 114. The terms "left" are "right" are utilized to distinguish the partitions, and should be apparent to a person of ordinary skill in the art that "left" and "right" are not to be limited by direction. The quadratic deviation is estimated as median of:

$$(X_i[n_d]\text{-med}_d)^2, i=1, 2, \ldots, k$$

where $X_i[n_d]$ is $n_d$ coordinate of point $X_i$. The method 100 continues by processing the "left" and "right" child recursively until the number of points in all leaf partitions becomes less or equal to M.

Method for Making Graph Edges

This recursive method is performed for all points in the set. In FIG. 2, an embodiment 200 of the present invention is shown wherein a two-dimensional (K=2) example for searching the closest point to point A in the right up direction (dir=RIGHT_UP) is illustrated. For this example, d=2, what means that the parent partition P has been divided by coordinate $n_2$. $P_L$ is the leaf partition and the "left" child of P and $P_R$ is the "right" child of P.

For this situation, the steps of the method are first, find the closest point to A ($n_{1A}$, $n_{2A}$) in $P_L$ by comparing distances to every point. Let it be some point C with referencing distance ref.

Second, as shown in the exemplary method 300 depicted in FIG. 3, a method for finding a closest point is utilized. This algorithm extends the closest point quest on other partitions in the tree. If the smallest distance $l_u$ from the partition $P_R$ to point A is less than ref 302, maybe the partition $P_R$ contains point that is closer to A than point C. The function, findInside($P_R$, dir, A, ref) may then be implemented 304, which will be described in relation to FIG. 5. If $l_u$ is not less than ref 302, then the closer point is not in $P_R$ and a determination is made as to whether the distance $l_r$ to a neighbouring partition $P_n$, which is one level up in the partitions tree, is less than ref 306. In that case, as in the case when $l_u$<ref, the same method 300 is applied to the parent partition of $P_L$ and $P_R$ in the partitions tree, partition P. As is shown in FIG. 3, the recursion will stop when $l_u \geq$ ref and $l_r \geq$ ref.

Third, the call findInside($P_R$, dir, A, ref) may encounter a variety of situations, such as the three following situations for chosen example. First, the partition $P_R$ may be divided horizontally as shown in the example 400 depicted in FIG. 4A. In this example, the left 402 and right 404 children are $P_{RL}$ and $P_{RR}$. Point T($n_{1T}$, $n_{2T}$) is the top outline point of $P_{RL}$, $C_0$ is the closest point to the bottom outline point of $P_{RR}$. As shown in FIG. 5, if $n_{1A} \leq n_{1T}$ then if l<ref, the closest point to A in the right child partition is $C_0$ and the left partition $P_{RL}$ is checked (depends on partitioning but could be one of the three cases we are describing). If $n_{1A}=n_{1T}$ the left partition 402 does not belong to considered subspace and after determining whether l<ref the process is done. If $n_{1A}>n_{1T}$, just the $P_{RR}$ partition is recursively examined.

Second, FIG. 4B depicts an embodiment 450 showing the situation in which $P_{RL}$ 452 is first examined and then if l is less then ref, $P_{RR}$ 454 is considered.

Third, in the case of the embodiment 470 shown in FIG. 4C a check is made for the possible closest point in the partition 472 by comparing distances from every partition point to A 474.

The method contains parts for all other situations other than those previously described, the previous discussion being an example thereof. After the closest point in every direction of matter is found for every graph point, graph edges are obtained connecting corresponding points.

Method for Reducing Number of Graph Vertexes

Next, a method for reducing the number of graph vertexes is employed. The steps of the method include the following. First, edges $e_i(X_s, X_e)$ are sorted by length in ascending order. $X_s$ and $X_e$ are start and end points of the edge. Second, the set of components is initialized so that every vertex (graph point) is single component $C_{Xi}$. In this way, the number of components matches the number of vertexes. Third, edges are processed one by one until the number of components becomes input parameter C.

If size $(C_{Xs}) \geq$ size $(C_{Xe})$, where size of the component is the number of belonging vertexes, a new component is made of these two components by moving all vertexes which have belonged to component $C_{Xe}$ to $C_{Xs}$. The component $C_{Xe}$ is then erased. If size($C_{Xs}$)<size($C_{Xe}$), $C_{Xs}$ is removed and $C_{Xe}$ expanded in the described way. Thus, the number of components is decreased by one. The next edge is then considered, as shown in FIG. 6.

FIG. 7 shows an exemplary program result for the two-dimensional test example.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method may be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for partitioning an integrated circuit, comprising:

partitioning an input set of points into a binary tree of partitions so that each leaf partition has maximally a defined number of points;

making graph edges for the points by connecting each point to its closest point in every of $2^K$ subspaces; and reducing number of graph elements to predefined value, wherein partitioning includes checking a number of points k in a current partition to determine if the number is greater than the maximally defined number of points M, if it is, a median is calculated for every K coordinate and a coordinate $n_d$ which has a greatest quadratic deviation is chosen as the coordinate by which the partition is divided into two smaller partitions, every point that has $n_d$ coordinate value less or equal to the value of its median $med_d$ is put into a first child partition and all other points into a second child partition.

2. The method as described in claim 1, wherein the quadratic deviation is calculated as a median of $(X_i[n_d] - med_d)^2$, i=1, 2, ..., k, where $X_i[n_d]$ is $n_d$ coordinate of point $X_i$.

3. The method as described in claim 1, wherein processing is continued recursively for the first child partition and the second child partition until number of points in all leaf partitions becomes less than or equal to the maximally defined number of points M.

4. The method as described in claim 1, wherein making graph edges includes finding a predetermined number of points in $2^K$ directions of matter.

5. The method as described in claim 4, wherein for K=2 four closest points are found in the four directions of matter, the directions of matter including right up, left up, left down and right down.

6. The method as described in claim 1, wherein making graph edges includes determining closest points for a given point A, first determining the closest point to A in its partition which has distance ref from A, then if the smallest distance from A to a child of the same node in the partitions tree is less than or equal to ref, the second child partition is examined for a closer point to A than ref and if it is not the case and the case is that the smallest distance from A to a neighbouring partition one level up in the partition tree is less then ref the same examination is applied to parent partition in the partitions tree.

7. The method as described in claim 1, wherein a reduced number of graph points is obtained by decreasing a number of components in the set of graph points until it becomes equal to a predefined specified program input parameter C.

8. The method as described in claim 1, wherein reducing a number of graph points includes:

sorting edges, wherein edges $e_i(X_s, X_e)$ are sorted by length in ascending order, $X_s$ and $X_e$ are start and end points of the edge;

initializing a set of components so that every graph point is a single component $C_{xi}$;

processing edges until the number of components is equal to input parameter C, wherein processing includes if size($C_{Xs}$)≧size($C_{Xe}$), where size of the component is the number of belonging vertexes, a new component is made of the two components by moving all vertexes which have belonged to component $C_{Xe}$ to $C_{Xs}$ and erasing component $C_{Xe}$, if it is not the case, $C_{Xs}$ is removed and $C_{Xe}$ expanded.

9. A method for partitioning an integrated circuit, comprising:

partitioning an input set of points into a binary tree of partitions so that each leaf partition of the binary tree has maximally a defined number of points;

making graph edges for the points by connecting each point to its closest point in every of $2^K$ subspaces; and factorizing number of graph points by decreasing a number of components in the set of graph points until it becomes equal to a predefined specified program input parameter C, wherein partitioning includes checking a number of points k in a current set to determine if the number is greater than the maximally defined number of points M, if it is, a median is calculated for every K coordinate and a coordinate $n_d$ which has a greatest quadratic deviation is chosen as the coordinate by which the partition is divided into two smaller partitions, every point that has $n_d$ coordinate value less or equal to the value of its median $med_d$ is put into a first child partition and all other points into a second child partition.

10. The method as described in claim 9, wherein the quadratic deviation is calculated as a median of $(X_i[n_d]-med_d)^2$, $i=1, 2, \ldots, k$, where $X_i[n_d]$ is $n_d$ coordinate of point $X_i$.

11. The method as described in claim 9, wherein processing is continued recursively for the first child partition and the second child partition until number of points in all leaf partitions becomes less than or equal to the maximally defined number of points M.

12. The method as described in claim 9, wherein making graph edges includes finding a maximum of $2^K$ closest points in $2^K$ directions of matter.

13. The method as described in claim 12, wherein for K=2 four closest points are found in the four directions of matter, the directions of matter including right up, left up, left down and right down.

14. The method as described in claim 9, wherein making graph edges includes determining closest points for a given point A, first determining the closest point to A in its partition which has distance ref from A, then if the smallest distance from A to a child of the same node in the partitions tree is less than or equal to ref, the second child partition is examined for a closer point to A than ref and if it is not the case and the case is that the smallest distance from A to a neighbouring partition one level up in the partition tree is less then ref the same examination is applied to parent partition in the partitions tree.

15. The method as described in claim 9, wherein reducing a number of graph points includes:
    sorting edges, wherein edges $e_f(X_s, X_e)$ are sorted by length in ascending order, $X_s$ and $X_e$ are start and end points of the edge;
    initializing a set of components so that every graph point is a single component $C_{Xi}$;
    processing edges until the number of components is equal to input parameter C, wherein processing includes if $size(C_{Xs}) \geq size(C_{Xe})$, where size of the component is the number of belonging vertexes, a new component is made of the two components by moving all vertexes which have belonged to component $C_{Xe}$ to $C_{Xs}$ and erasing component $C_{Xe}$, if it is not the case, $C_{Xs}$ is removed and $C_{Xe}$ expanded.

16. A system, comprising:
    a memory suitable for storing a program of instructions; and
    a processor communicatively coupled to the memory, the processor suitable for performing a program of instructions, wherein the program of instructions configures the processor to
    partition an input set of points into a binary tree of partitions so that each leaf partition of the binary tree has maximally a defined number of points;
    making graph edges for the points by connecting each point to its closest point in every of $2^K$ subspaces; and
    factorize number of graph points by decreasing a number of components in the set of graph points until it becomes equal to a predefined specified program input parameter C, wherein partitioning includes checking a number of points k in a current partition to determine if the number is greater than the maximally defined number of points M, if it is, a median is calculated for every K coordinate and a coordinate $n_d$ which has a greatest quadratic deviation is chosen as the coordinate by which the partition is divided into two smaller partitions, every point that has $n_d$ coordinate value less or equal to the value of its median $med_d$ is put into a first child partition and all other points into a second child partition.

17. The system as described in claim 16, wherein the quadratic deviation is calculated as a median of $(X_i[n_d]-med_d)^2$, $i=1, 2, \ldots, k$, where $X_i[n_d]$ is $n_d$ coordinate of point $X_i$.

18. The system as described in claim 16, wherein processing is continued recursively for the first child partition and the second child partition until number of points in all leaf partitions becomes less than or equal to the maximally defined number of points M.

19. The system as described in claim 16, wherein making graph edges includes finding a predetermined number of points in $2^K$ directions of matter.

20. The system as described in claim 19, wherein for K=2 four closest points are found in the four directions of matter, the directions of matter including right up, left up, left down and right down.

21. The system as described in claim 16, wherein making graph edges includes determining closest points for a given point A, first determining the closest point to A in its partition which has distance ref from A, then if the smallest distance from A to a child of the same node in the partitions tree is less than or equal to ref, the second child partition is examined for a closer point to A than ref and if it is not the case and the case is that the smallest distance from A to a neighbouring partition one level up in the partition tree is less then ref the same examination is applied to parent partition in the partitions tree.

22. The system as described in claim 16, wherein reducing a number of graph points includes:
    sorting edges, wherein edges $e_f(X_s, X_e)$ are sorted by length in ascending order, $X_s$ and $X_e$ are start and end points of the edge;
    initializing a set of components so that every graph point is a single component $C_{Xi}$;
    processing edges until the number of components is equal to input parameter C, wherein processing includes if $size(C_{Xs}) \geq size(C_{Xe})$, where size of the component is the number of belonging vertexes, a new component is made of the two components by moving all vertexes which have belonged to component $C_{Xe}$ to $C_{Xs}$ and erasing component $C_{Xe}$, if it is not the case, $C_{Xs}$ is removed and $C_{Xe}$ expanded.

23. A system for partitioning an integrated circuit, comprising:
    a means for partitioning an input set of points into a binary tree of partitions so that each leaf partition has maximally a defined number of points;
    a means for making graph edges for the points, the graph edge means communicatively coupled to the partitioning means, wherein the graph edges means connects each point to maximum $2^K$ closest points to make edges of the graph; and
    a means for reducing number of graph points communicatively coupled to the graph edge means, wherein the reducing means decreasing a number of components in the set of graph points until it becomes equal to a predefined specified program input parameter C, wherein partitioning includes checking a number of points k in a current partition to determine if the number is greater than the maximally defined number of points M, if it is, a median is calculated for every K coordinate and a coordinate $n_d$ which has a greatest quadratic deviation is chosen as the coordinate by which the partition is divided into two smaller partitions, every point that has $n_d$ coordinate value less or equal to the value of its median $med_d$ is put into a first child partition and all other points into a second child partition.

* * * * *